(12) United States Patent
Ohtake

(10) Patent No.: US 10,700,053 B2
(45) Date of Patent: Jun. 30, 2020

(54) ELECTROSTATIC PROTECTION ELEMENT

(71) Applicant: LAPIS Semiconductor Co., Ltd., Yokohama (JP)

(72) Inventor: Hisao Ohtake, Yokohama (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 0 days.

(21) Appl. No.: 16/042,655

(22) Filed: Jul. 23, 2018

(65) Prior Publication Data
US 2019/0035777 A1    Jan. 31, 2019

(30) Foreign Application Priority Data

Jul. 25, 2017 (JP) .................................. 2017-143362

(51) Int. Cl.
| | |
|---|---|
| *H01L 21/70* | (2006.01) |
| *H01L 27/02* | (2006.01) |
| *H01L 23/60* | (2006.01) |
| *H01L 21/8234* | (2006.01) |
| *H01L 21/762* | (2006.01) |

(52) U.S. Cl.
CPC ........ *H01L 27/0255* (2013.01); *H01L 21/762* (2013.01); *H01L 21/76224* (2013.01); *H01L 21/823475* (2013.01); *H01L 21/823493* (2013.01); *H01L 23/60* (2013.01); *H01L 27/027* (2013.01)

(58) Field of Classification Search
USPC .......... 257/499, E31.696, E27.015, E29.184, 257/E29.187, E29.197, E29.225, 335, 257/343; 438/414, 309, 202, 234
See application file for complete search history.

(56) References Cited

U.S. PATENT DOCUMENTS

| | | | | |
|---|---|---|---|---|
| 5,959,332 | A * | 9/1999 | Ravanelli | H01L 27/0251 257/133 |
| 6,724,050 | B2 * | 4/2004 | Salling | H01L 27/0259 257/361 |
| 2002/0070408 | A1 * | 6/2002 | Schnaitter | H01L 27/0259 257/356 |
| 2013/0228868 | A1 * | 9/2013 | Stribley | H01L 27/027 257/360 |
| 2016/0148925 | A1 * | 5/2016 | Tonazzo | H01L 27/0259 257/361 |
| 2018/0286855 | A1 * | 10/2018 | Lai | H01L 27/0277 |

FOREIGN PATENT DOCUMENTS

JP     2003-258200 A     9/2003

* cited by examiner

*Primary Examiner* — Niki H Nguyen
(74) *Attorney, Agent, or Firm* — Rabin & Berdo, P.C.

(57) ABSTRACT

An electrostatic protection element includes a substrate of a first conductivity type, an epitaxial layer formed on the substrate, the epitaxial layer being of a second conductivity type; a well formed on the epitaxial layer, the well being of the first conductivity type; a transistor formed inside of the well, the transistor including a drain region, a source region formed to face the drain region across a channel region, and a gate formed above the channel region so as to be insulated; and a well contact region of the first conductivity type disposed so as to form an opposing region where the drain region and the well contact region face each other while being separated by a prescribed distance in a direction parallel to at least an extension direction of the gate.

12 Claims, 8 Drawing Sheets

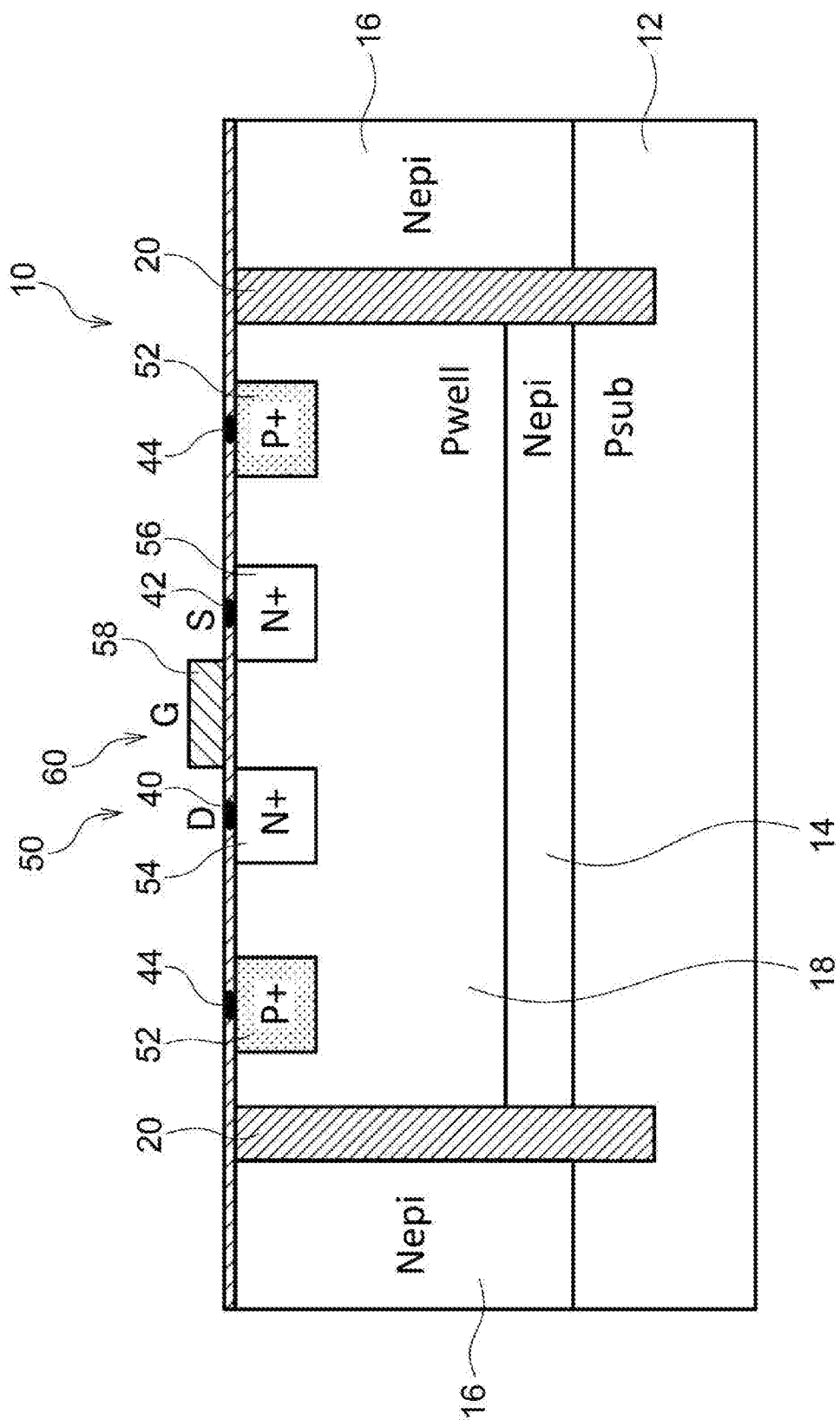

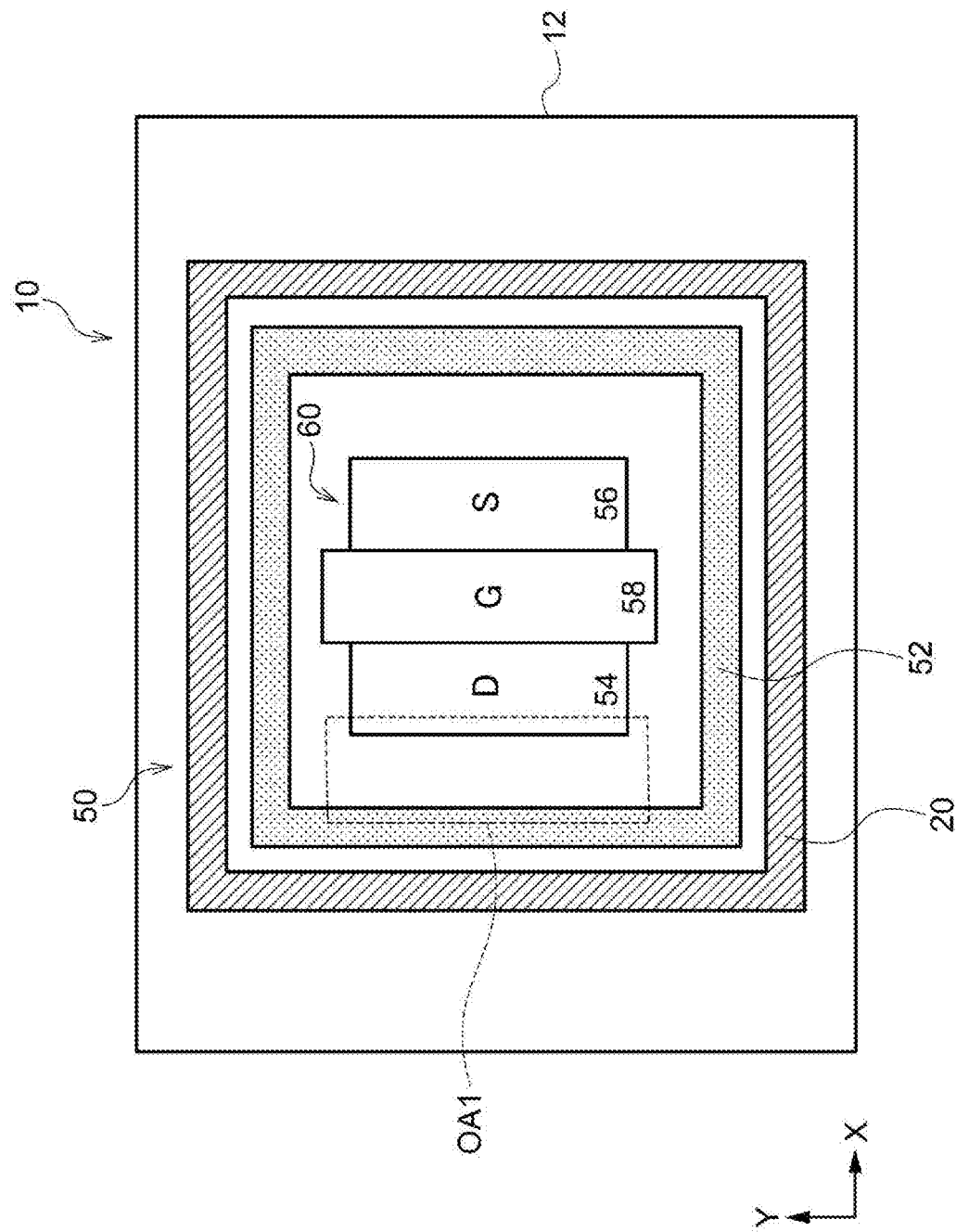

ELECTROSTATIC PROTECTION ELEMENT

BACKGROUND OF THE INVENTION

Technical Field

The present invention relates to an electrostatic protection element and a semiconductor device, and in particular, relates to an electrostatic protection element in a semiconductor device having an element isolation structure using an insulating trench, and a semiconductor device using such an electrostatic protection element.

Background Arts

In recent years, a semiconductor device using an insulating trench (element isolation trench) such as STI (shallow trench isolation) or DTI (depp trench isolation) has been developed. The insulating trench is one of the element isolation techniques for a high breakdown voltage element. On the other hand, as the miniaturization and integration of a semiconductor device advance, there is a stronger demand for an electrostatic protection element to have a higher ESD (electrostatic discharge) resistance while suppressing an increase in size.

Examples of the patent documents related to an electrostatic protection element using DTI include Japanese Patent Application Laid-open Publication No. 2003-258200 (Patent Document 1). In an ESD protection transistor disclosed in Patent Document 1, DTI formed between the drain region and the substrate contact region of a gate grounded (GG) NMOS transistor is formed to deep enough to exceed the thickness of the P-type well in which the drain region is formed and reach the P-type substrate. The drain, gate and source are located inside of DTI, and the substrate contact is located outside of DTI. Patent Document 1 describes that this configuration makes it easier for the parasitic BJT of the GGMOS transistor to operate, and improves the ESD protection capabilities.

SUMMARY OF THE INVENTION

However, although the ESD protection transistor of Patent Document 1 employs DTI, because an electric current flows through Psub (P-type substrate) when external disturbance such as ESD surge or latch-up pulse is applied, the potential of Psub would be unstable. That is, the ESD protection transistor allows an electric current due to external disturbance to flow through the substrate contact, which makes latch-up with peripheral circuits or erroneous circuit operation more likely to occur. This means that the function of DTI, i.e., the effective isolation from the peripheral circuits, is not fully utilized.

The present invention was made in view of the problems described above, and is aiming at providing an electrostatic protection element that can utilize the function of a semiconductor device having an isolation trench more effectively and that can suppress erroneous operation caused by a change in substrate potential, and a semiconductor device.

An electrostatic protection element according to the present invention includes: a substrate of a first conductivity type; an epitaxial layer formed on the substrate, the epitaxial layer being of a second conductivity type; a well of the first conductivity type formed on the epitaxial layer; a transistor formed inside of the well, the transistor including a drain region, a source region formed to face the drain region across a channel region, and a gate formed above the channel region so as to be insulated; and a well contact region of the first conductivity type disposed in the well on an opposite side of the drain region from the gate in a width direction so as to form an opposing region in the well where the drain region and the well contact region face each other, the opposing region extending in a length direction parallel to a length of the gate.

Further, a semiconductor device according to the present invention includes: an internal circuit having a connection terminal to be connected externally and configured to perform prescribed processes; and the above-described electrostatic protection element in which the gate and the source region are grounded and the drain region is connected to the connection terminal.

According to the present invention, it is possible to provide an electrostatic protection element that can utilize the function of a semiconductor device having an isolation trench more effectively and that can suppress erroneous operation caused by a change in substrate potential, and a semiconductor device.

BRIEF DESCRIPTION OF THE DRAWINGS

FIG. 1 is a vertical cross-sectional view showing an example of the configuration of a semiconductor device including an electrostatic protection element of Embodiment 1.

FIG. 2 is a plan view showing an example of the configuration of a semiconductor device including an electrostatic protection element of Embodiment 1.

DETAILED DESCRIPTION OF THE INVENTION

Figure 3A:
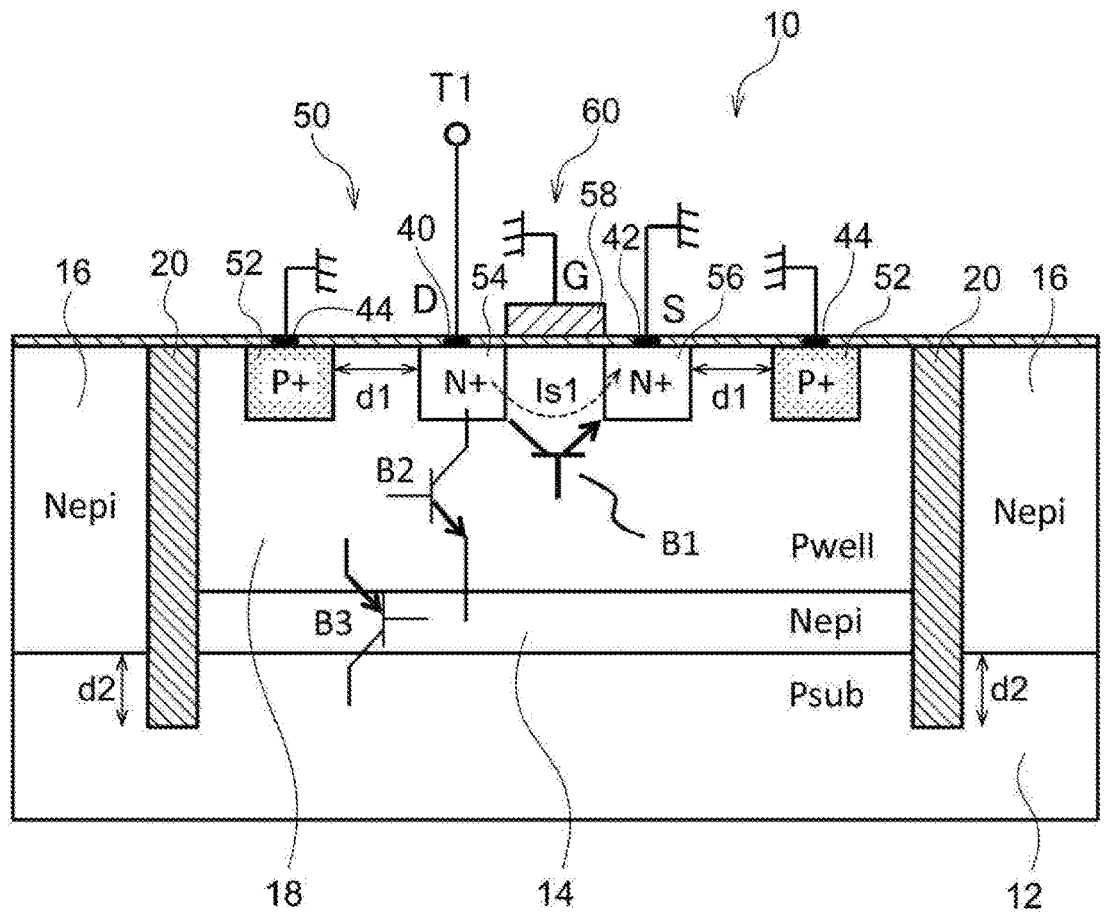
FIG. 3A is a cross-sectional view of the electrostatic protection element of Embodiment 1 for explaining the connection and operation thereof.

Below, embodiments of the present invention will be explained in detail with reference to figures.

Embodiment 1

An electrostaotic protection element 50 (will also referred to as an ESD protection element) and a semiconductor device 10 of this embodiment will be explained with reference to FIGS. 1 to 3. FIG. 1 is a cross-sectional view of the semiconductor device 10 including the electrostatic protection element 50, and FIG. 2 is a plan view of the semiconductor device 10. FIG. 3 shows the operation of the electrostatic protection element 50, and the connection thereof inside of the semiconductor device 10.

As shown in FIG. 1, the semiconductor device 10 includes a P type substrate 12 (denoted as "Psub" in FIG. 1), N type epitaxial layers 14 and 16 (denoted as "Nepi" in FIG. 1) formed on the P type substrate 12, and a P-type well region 18 (denoted as "Pwell" in FIG. 1) formed on the N-type epitaxial layer 14. Although the semiconductor device 10 includes an internal circuit portion (hereinafter referred to as an "internal circuit") including a circuit to which the electrostatic protection element 50 is connected, the internal circuit is not shown in FIG. 1.

On the other hand, the main body of the electrostatic protection element 50 is an ESD protection transistor 60. That is, as show in FIG. 1, the ESD protection transistor 60 includes a drain region 54 and a source region 56 formed by diffusing an N-type impurity in the P-type well region 18, and a gate 58 formed above the P-type substrate 12 with an oxide film (not shown in the figure) interposed therebetween. That is, the ESD protection transistor 60 is a MOS FET (Metal Oxide Semiconductor Field Effect Transistor) constituted of the drain region 54, the source region 56, and the gate 58 (electrode). This means that a portion below the gate 58 is a channel region (not shown in the figure). A drain 40 (electrode) is connected to the drain region 54, and a source 42 (electrode) is connected to the source region 56. A well contact 44 (electrode) is connected to a well contact region 52, which will be described below. FIG. 1 shows the configuration using the N-type MOS transistor as an example, the invention is not limited to an N-type MOS transistor, and it is possible to use a P-type MOS transistor.

The electrostatic protection device 50 of this embodiment further includes the well contact region 52 provided outside the ESD protection transistor 60, and a DTI portion 20 provided further outside the well contact region 52. The well contact region 52 is formed at a position separated from the drain region 54 by a prescribed distance d1 (see FIG. 3A). The DTI portion 20 is deep enough to reach the inside of the P-type substrate 12 by a prescribed depth d2 (see FIG. 3A). The specific value of the depth d2 can be greater than zero but not exceeding several μm.

As shown in FIG. 2, in this embodiment, the well contact region 52 is formed so as to surround the ESD protection transistor 60, and the DTI portion 20 further surrounds the well contact region 52. In the present embodiment, the well contact region 52 entirely surrounds the ESD protection transistor in both a length direction (Y) of the gate 58 and in a width direction (X) of the gate 58, where the gate 58 has a longer length in the length direction (Y) than in the width direction (X). Similarly, the DTI portion 20 entirely surrounds the well contact region 52 in the length direction (Y) of the gate 58 and the width direction (X) of the gate. That is, as shown in FIG. 2, the ESD protection transistor 60 of this embodiment is formed inside the well contact region 52 and the DTI portion 20. Therefore, in the electrostatic protection element 50, the opposing region OA1 is formed between the outer edge portion of the drain region 54 along the length direction of the gate 58 (the Y axis direction shown in FIG. 2) and the well contact region 52 formed on the outside.

The connection of the electrostatic protection element 50 will be explained with reference to FIG. 3. As shown in FIG. 3A, in the ESD protection transistor 60 of this embodiment, the source 42 and the gate 58 are grounded (connected to GND (ground)), and a terminal T1 for connecting to the internal circuit of the semiconductor device 10 (circuit for realizing the intended function in the semiconductor device 10) is taken out from the drain 40. This connection is made by a wiring layer. That is, the ESD protection transistor 60 is connected so as to form a GG-NMOS transistor.

As shown in FIG. 3, because the N-type epitaxial layer 14 is interposed between the electrostatic protection element 50 of this embodiment and the P-type substrate 12, the P-type substrate 12 is in a floating state with respect to the electrostatic protection element 50. That is, the potential of the electrostatic protection element 50 is floating with respect to the P-type substrate 12. Furthermore, since the P-type well region 18 where the ESD protection transistor 60 and the well contact region 52 are formed is separated from peripheral circuits by the DTI portion 20, the electrostatic protection element 50 of this embodiment is isolated from the peripheral circuits and in a floating state. Thus, even if an electric current flows through the electrostatic protection element 50 by the external disturbance surge, the electric current does not flow to the peripheral circuits from the electrostatic protection element 50.

Figure 3B:
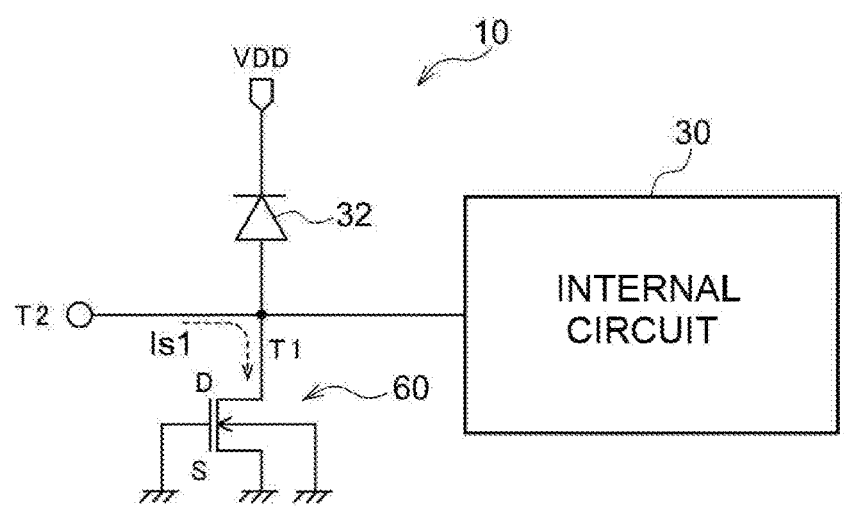
FIG. 3B is a circuit diagram showing the connection of the electrostatic protection element of Embodiment 1 in a semiconductor device.

As shown in FIG. 3B, the terminal T1 (or the drain 40) of the ESD protection transistor 60 is connected to the terminal T2 of the internal circuit 30. That is, the ESD protection transistor 60 of this embodiment is connected between the terminal of the internal circuit 30 and GND. Between the terminal T2 and the power supply (VDD), a normal electrostatic protection element 32 constituted of a diode or the like may be connected. The terminal T2 may be an input terminal, output terminal, or power supply terminal of the internal circuit 30.

The operation of the electrostatic protection element 50 will be explained with reference to FIG. 3A. In the electrostatic protection element 50, as shown in FIG. 3A, an NPN-type parasitic bipolar transistor B1 is realized by the N-type drain region 54, the P-type well region 18, and the N-type source region 56. With this configuration, when a high voltage surge (hereinafter referred to as "disturbance surge") such as an ESD surge or a latch-up pulse is applied to the terminal T1 (the drain region 54) via the terminal T2 of the semiconductor device 10, the parasitic bipolar transistor B1 is turned on, and the surge current Is1 flows from the drain region 54 toward the source region 56, which makes it possible to release the disturbance surge. As a result, damage or breakage of the internal circuit 30 and the like due to the disturbance surge can be suppressed. The parasitic bipolar transistor B1 is turned on due to the snapback characteristic, which the parasitic bipolar transistor B1 is known to have.

Here, the effects of other parasitic bipolar transistors in the electrostatic protection element 50 will be discussed. First, an NPN-type parasitic bipolar transistor B2 is realized by the N-type drain region 54, the P-type well region 18, and the N-type epitaxial layer 14. A PNP-type parasitic bipolar transistor B3 is realized by the P-type well region 18, the N-type epitaxial layer 14, and the P-type substrate 12.

Since the P-type substrate 12 is in a floating state, when a positive external disturbance surge is applied to the terminal T2, the parasitic bipolar transistors B2 and B3 are turned on and the potential of the P-type substrate 12 rises. This rise in potential of the P-type substrate 12 makes some problems more likely to occur such as latch-up with the peripheral circuits or erroneous operation of the circuits in the semiconductor device 10.

However, in the example of this embodiment, because of the opposing region OA1 where the drain region 54 and the well contact region 52 face each other over the distance d1, the current due to the disturbance surge flows from the drain region 54 to the well contact region 52, and the potential fluctuation of the P-type well region 18 is suppressed. As a result, the rise in potential of the P-type substrate 12 is suppressed, which makes the latch-up with peripheral circuits or erroneous circuit operation to less likely to occur. That is, the well contact region 52 connected to the ground has the function of stabilizing the potential of the P-type substrate 12. The optimal value of the distance d1 can be found through a study or simulation based on the potential stabilizing effect for the P-type substrate 12.

As described in detail above, with the electrostatic protection element and the semiconductor device of this embodiment, it is possible to utilize the function of a semiconductor device having an isolation trench more effectively and to suppress erroneous operation caused by a change in substrate potential.

Embodiment 2

Figure 4:
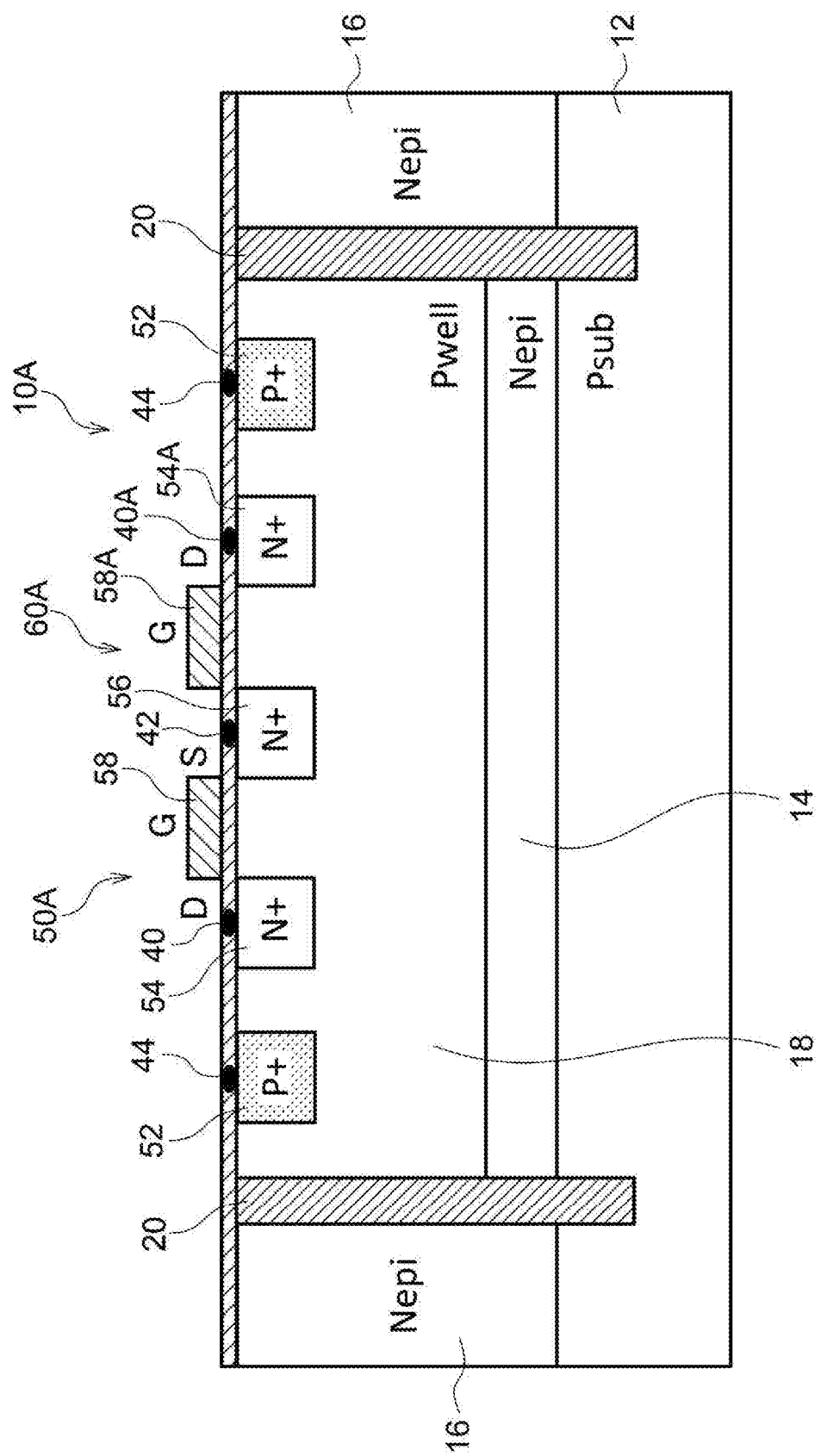
FIG. 4 is a vertical cross-sectional view showing an example of the configuration of a semiconductor device including an electrostatic protection element of Embodiment 2.
Figure 5:
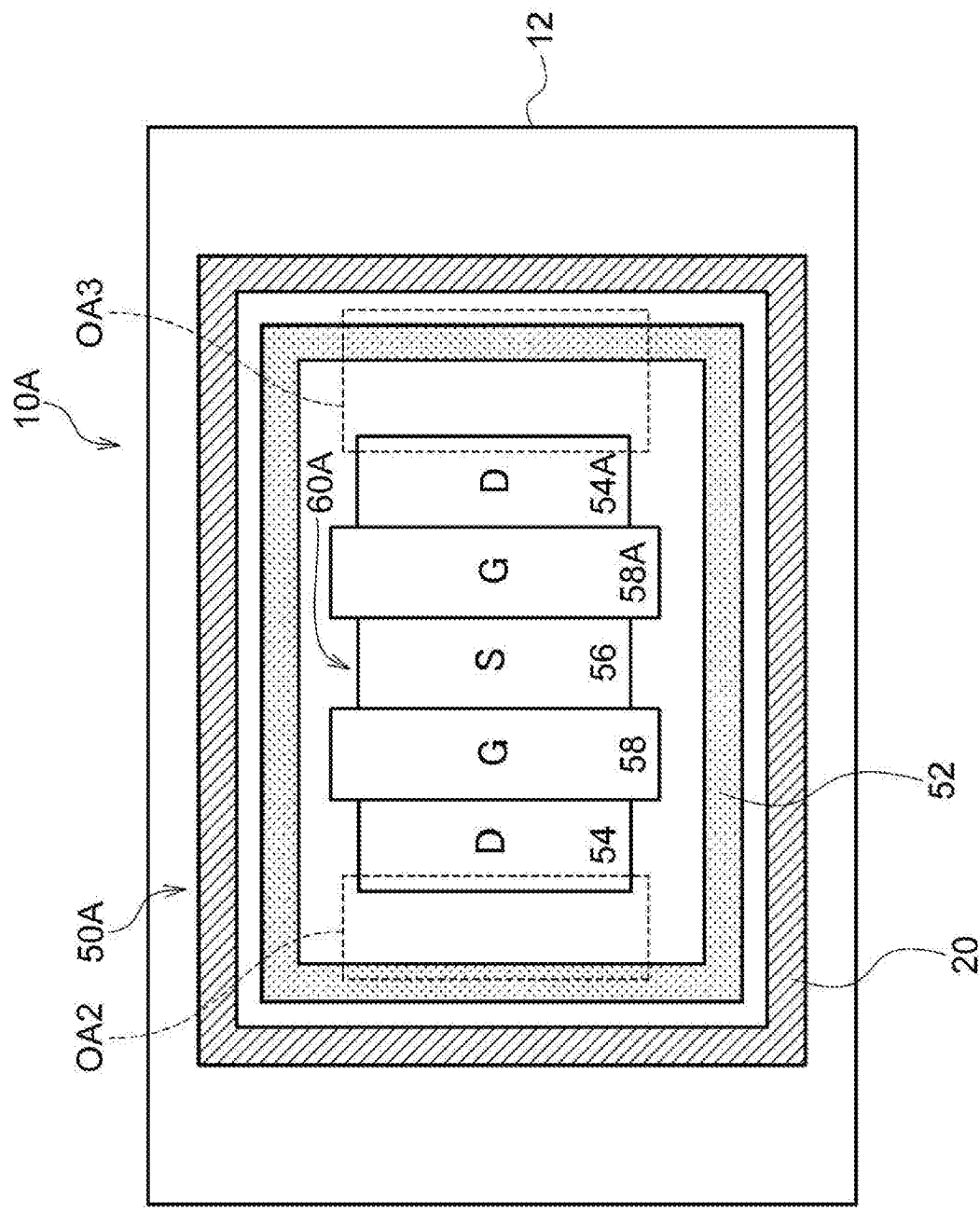
FIG. 5 is a plan view showing an example of the configuration of a semiconductor device including the electrostatic protection element of Embodiment 2.
Figure 6:
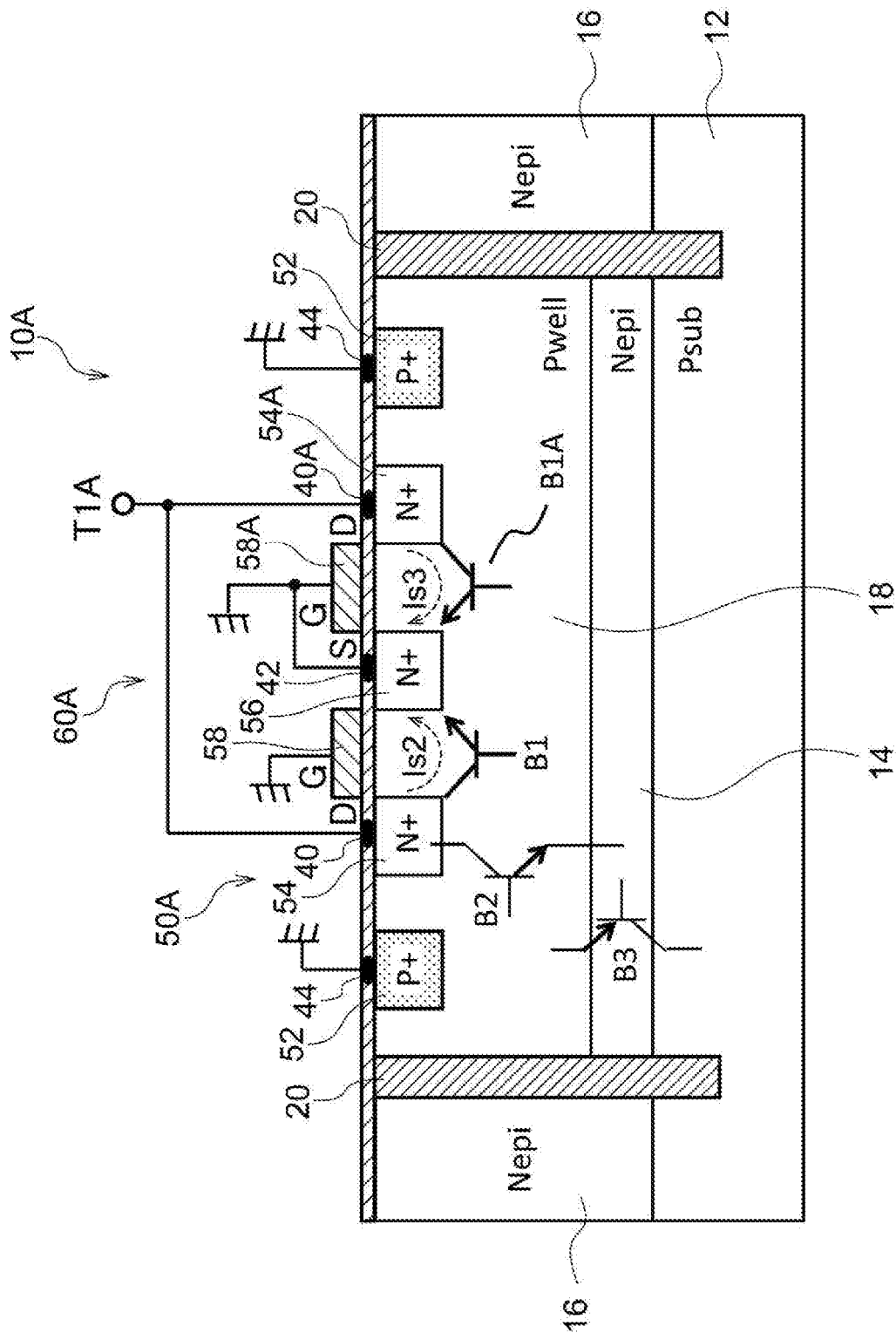
FIG. 6 is a cross-sectional view for explaining the operation of the electrostatic protection element of Embodiment 2.

A semiconductor device 10A equipped with the electrostaotic protection element 50A of this embodiment will be explained with reference to FIGS. 4 to 6. FIG. 4 is a cross-sectional view of the semiconductor device 10A including the electrostatic protection element 50A, and FIG. 5 is a plan view of the semiconductor device 10. FIG. 6 is a diagram explaining the operation of the electrostatic protection element 50A.

The electrostatic protection element 50A of this embodiment also includes an ESD protection transistor 60A configured as a GG-NMOS transistor, but this embodiment differs from Embodiment 1 in that the ESD protection transistor has a plurality of transistor parts. Thus, the configurations similar to those of the electrostatic protection element 50 of Embodiment 1 will be given the same reference characters and the detailed descriptions thereof will not be repeated.

As shown in FIG. 4, the ESD protection transistor 60A of this embodiment includes two gates 58 and 58A. A channel region, which is not shown in the figure, is formed below the gate 58, and a drain region 54 and a source region 56 are formed at respective sides of the channel region. Below the gate 58A, a channel region (not shown in the figure) is formed, and one end of the channel region is the source region 56, and at the other end thereof, a drain region 54A is formed. The drain 40 is connected to the drain region 54, the source 42 is connected to the source region 56, and the drain 40A is connected to the drain region 54A. That is, in the ESD protection transistor 60A of FIG. 6, the source region 56 is commonly used by two NMOS transistors.

In a manner similar to the ESD protection transistor 60, the ESD protection transistor 60A is configured such that the well contact region 52 is formed outside the ESD protection transistor 60A, and the DTI portion 20 is formed outside the well contact region 52. The DTI portion 20 has a prescribed depth d2 (see FIG. 3A) and is formed to reach the inside of the P-type substrate 12. The drain region 54 and the well contact region 52 are formed so as to face each other, separated by a prescribed distance d1 (see FIG. 3A).

As shown in FIG. 5, in a manner similar to the electrostatic protection element 50, the electrostatic protection element 50A is configured such that the well contact region 52 is formed to surround the ESD protection transistor 60A, and the DTI portion 20 is formed to surround the well contact region 52. In the present embodiment, the well contact region 52 entirely surrounds the ESD protection transistor 60A in both a length direction of the gates 58, 58A and in a width direction of the gates 58, 58A where the gates 58, 58A have a longer length in the length direction than in the width direction. Similarly, the DTI portion 20 entirely surrounds the well contact region 52 in the length direction of the gates 58, 58A and the width direction of the gates 58, 58A. The electrostatic protection element 50A also has the opposing region formed by the drain region and the well contact region, but as shown in FIG. 5, the electrostatic protection element 50A differs from the electrostatic protection element 50 in having two opposing regions OA2 and OA3.

Next, with reference to FIG. 6, the connection and operation of the electrostatic protection element 50A will be explained. As shown in FIG. 6, the drains 40 and 40A of the ESD protection transistor 60A are connected to a terminal T1A, and the gates 58 and 58A and the source 42 are connected to GND. The ESD protection transistor 60A in the semiconductor device 10A can be connected in the same manner as FIG. 3B.

Similarly to the electrostatic protection element 50, in the electrostatic protection element 50A, the NPN-type parasitic bipolar transistor B1 is realized by the drain region 54, the P-type well region 18, and the source region 56, but in the electrostatic protection element 50A, an NPN-type parasitic bipolar transistor B1A is also realized by the drain region MA, the P-type well region 18, and the source region 56. In this configuration, when disturbance surge is applied to the terminal T1A, the parasitic bipolar transistor B1 is turned on, causing a surge current Is2 to flow, and at the same time, the parasitic bipolar transistor B1A is turned on, causing a surge current Is3 to flow. This way, the disturbance surge can be released, and as a result, damage or breakage of the internal circuit 30 and the like due to the disturbance surge can be suppressed. Further, according to the ESD protection transistor 60A of this embodiment, as shown in FIG. 5, the NMOS transistor of a predetermined size is divided into two, and therefore, the same total gate width is realized with a smaller area.

Other parasitic bipolar transistors than the parasitic bipolar transistors B1 and B1A will be discussed below. In a manner similar to the electrostatic protection element 50, the parasitic bipolar transistors B2 and B3 are also formed in the electrostatic protection element 50A. That is, as described above, the drain region 54, the P-type well region 18, and the N-type epitaxial layer 14 form the NPN type parasitic bipolar transistor B2, and the P type well region 18, the N-type epitaxial layer 14, and the P-type substrate 12 form the PNP type parasitic bipolar transistor B3.

On the other hand, since the P-type substrate 12 is in a floating state, when positive external disturbance surge is applied, the parasitic bipolar transistors B2 and B3 are turned on and the potential of the P type substrate 12 rises. This rise in potential of the P-type substrate 12 makes some problems more likely to occur such as latch-up with the peripheral circuits or erroneous operation of the circuits. However, in the electrostatic protection element 50A of this embodiment, the opposing region is provided between the drain 40, 40A and the well contact region 52, and as shown in FIG. 5, two opposing regions OA2 and OA3 are provided as the opposing region. This makes it possible to further suppress the potential fluctuation of the P-type well region 18 as compared with Embodiment 1. Because the potential fluctuation at the P-type substrate 12 is suppressed, the problems such as latch-up and erroneous circuit operation can be suppressed more effectively.

Modification Example of Embodiment 2

A modification example of Embodiment 2 will be explained with reference to FIG. 7. In this modification example, the number of GG-NMOS included in the ESD protection transistor 60A of the embodiment described above is changed. In the embodiment described above, the ESD protection transistor had two GG-NMOS transistors, but the number of GG-NMOS transistors is not limited to one or two, and it is possible to dispose as many GG-NMOS transistors as necessary, taking into consideration the current capacity or the like of the electrostatic protection element.

Figure 7A:
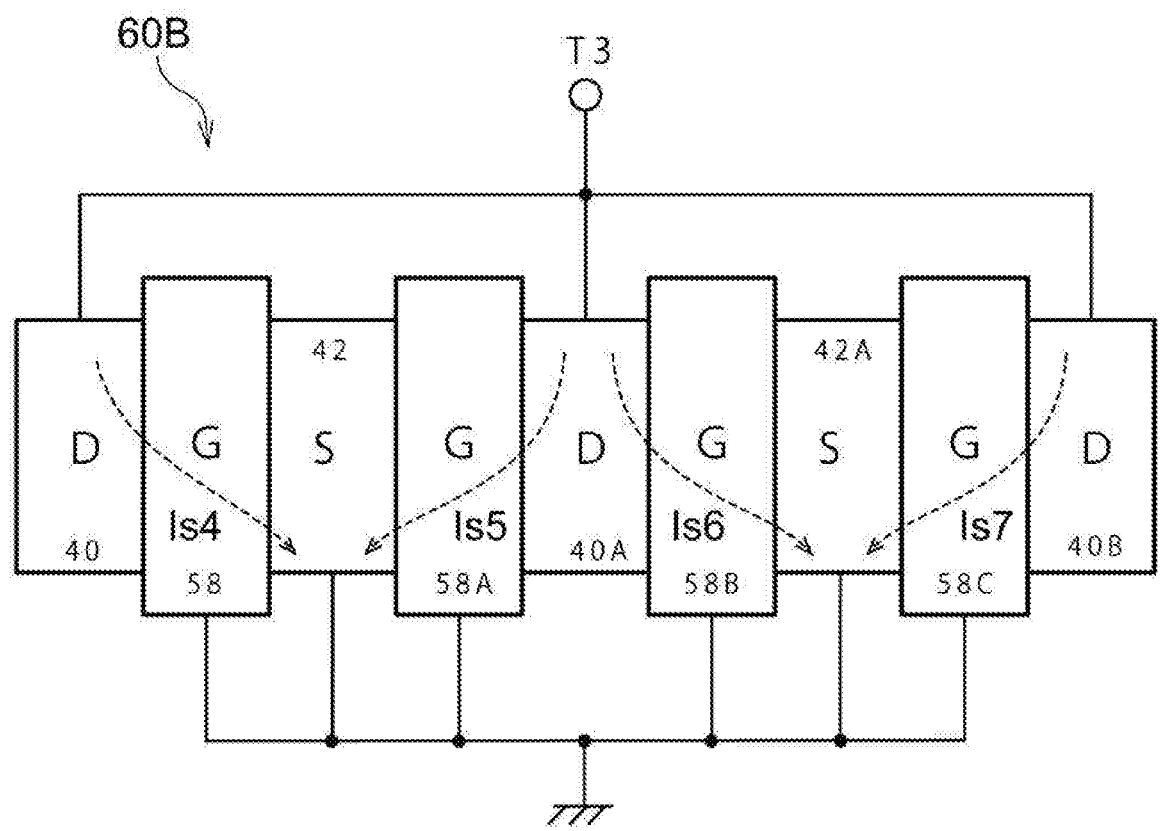
FIG. 7A is a diagram showing an electrostatic protection element constituted of four MOS transistors.

FIG. 7A shows an ESD protection transistor 60B having four GG-NMOS transistors. As shown in FIG. 7A, the ESD protection transistor 60B has gates 58, 58A, 58B, 58C, drains 40, 40A, 40B, and sources 42, 42A. As shown in FIG. 7A, the gates 58, 58A, 58B, 58C and the sources 42, 42A are connected to GND, and the drains 40, 40A, 40B are connected to the terminal T3 for connecting the electrostatic protection element including the ESD protection transistor 60B to the internal circuit 30.

A first GG-NMOS transistor (hereinafter, "first NMOS") is constituted of the gate 58, the drain 40, and the source 42, the second GG-NMOS transistor (hereinafter "second NMOS") is constituted of the gate 58A, the drain 40A, and the source 42, the third GG-NMOS transistor (hereinafter "third NMOS") is constituted of the gate 58B, the drain 40A, and the source 42A, and the fourth GG-NMOS transistor (hereinafter "fourth NMOS") is constituted of the gate 58C, the drain 40B, and the source 42A. That is, the source 42 is commonly used by the first NMOS and the second NMOS, the source 42A is commonly used by the third NMOS and the fourth NMOS, and the drain 40A is commonly used by the second NMOS and the third NMOS.

In other words, the ESD protection transistor 60B shown in FIG. 7A is configured such that the gate 58A is disposed between the first NMOS and the third NMOS, and the gate 58C is disposed between the third NMOS and the drain 40B.

If disturbance surge is applied to the terminal T3 of the electrostatic protection element including the ESD protection transistor 60B, surge currents Is4, Is5, Is6, and Is7 are made to flow as shown in FIG. 7A. This makes it possible to prevent damage or breakage of the internal circuit 30. With the ESD protection transistor 60B of this embodiment, it is possible to realize an electrostatic protection element that is smaller in size and having greater current capacity. Because the number of GG-NMOS transistors is an even number, it is possible to have two opposing regions OA in a manner similar to the ESD protection transistor 60A of FIG. 5, and therefore, the stability of the P-type well region 18 is improved. The two opposing regions OA can be formed if the number of GG-NMOS transistors is not only two or four, but also any even number.

Figure 7B:
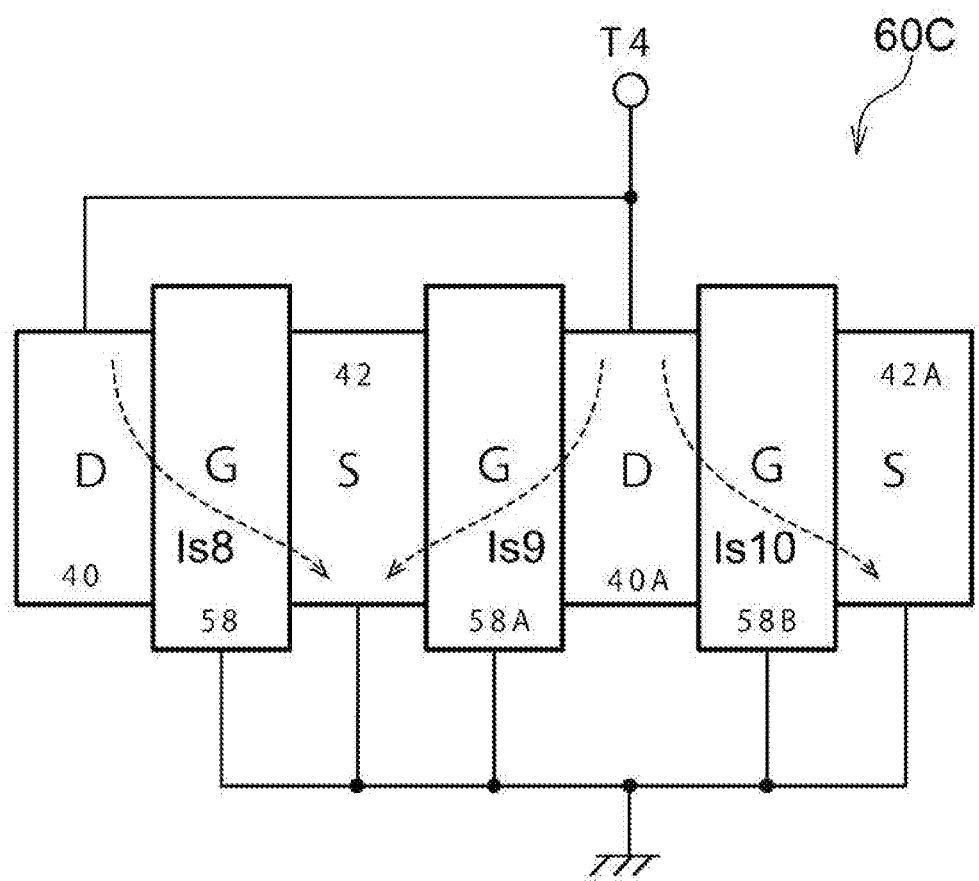
FIG. 7B is a diagram showing an electrostatic protection element constituted of three MOS transistors.

The number of GG-NMOS transistors is not limited to an even number. FIG. 7B shows an ESD protection transistor 60C having three GG-NMOS transistors. As shown in FIG. 7B, the ESD protection transistor 60C has gates 58, 58A, 58B, drains 40, 40A, and sources 42, 42A. As shown in FIG. 7B, the gates 58, 58A, 58B and the sources 42, 42A are connected to GND, and the drains 40, 40A are connected to the terminal T4 for connecting the electrostatic protection element including the ESD protection transistor 60C to the internal circuit 30.

The first NMOS is constituted of the gate 58, the drain 40, and the source 42, the second NMOS is constituted of the gate 58A, the drain 40A, and the source 42, and the third NMOS is constituted of the gate 58B, the drain 40A, and the source 42A. That is, the source 42 is commonly used by the first NMOS and the second NMOS, and the drain 40A is commonly used by the second NMOS and the third NMOS.

In other words, the ESD protection transistor 60C shown in FIG. 7B is configured such that the gate 58A is disposed between the first NMOS and the third NMOS If disturbance surge is applied to the terminal T4 of the electrostatic protection element including the ESD protection transistor 60C, surge currents Is8, Is9, and Is10 are made to flow as shown in FIG. 7B. This makes it possible to prevent damage or breakage of the internal circuit 30. With the ESD protection transistor 60C of this embodiment, it is possible to realize an electrostatic protection element that is smaller in size and having greater current capacity.

As described above, the number of the GG-NMOS transistors in the ESD protection transistor of this embodiment can be any appropriate number, taking into consideration the required current capacity, the layout size, and the like.

In the respective embodiments described above, the configuration in which the ESD protection transistor uses a gate-grounded NMOS transistor (GG-NMOS transistor) was described as an example, but the present invention is not limited to this. For example, the ESD protection transistor may be configured as an active clamp type where a resistance and other circuits are connected to the gate so that the NMOS transistor is turned on when surge is applied, thereby releasing the surge. Furthermore, the ESD protection transistor may use PMOS transistors instead of NMOS transistors. In this case, N can be replaced with P, and P can be replaced with N in the descriptions of the respective embodiments above.

In the respective embodiments above, the configuration in which the well contact region (52) is formed so as to entirely surround the ESD protection transistor (60, 60A, 60B, and 60C) was described as an example, but the present invention is not limited to this embodiment. The well contact region 52 may be formed only in an area included in the opposing region OA1 along the Y-axis direction in FIG. 2, for example, as long as at least one opposing region (OA1, OA2, or OA3) is formed. For example, referring to FIG. 2, embodiments of the invention include a linear-shaped well contact region 52 having only a portion of the well contact region 52 in FIG. 2 that extends in the length direction (Y-axis), and not including a portion extending in the width direction (X-axis). In embodiments in which the well contact region does not extend in the width direction (X-axis), the well contact region 52 may have a length longer than, or equal to, a length of the drain 54. Embodiments of the invention also encompass a well contact region 52 having a length in the length direction (Y-axis) greater than a length of the gate 58, and the well contact region 52 extending only partially in the width direction (X-axis).

DESCRIPTIONS OF THE REFERENCE CHARACTERS 10, 10A Semiconductor Device
12 P-type Substrate
14, 16 N-type Epitaxial Layer
18 P-type Well Region
20 DTI Portion
30 Internal Circuit
32 Electrostatic Protection Element
40, 40, 40B Drain
42, 42A Source
44 Well Contact
50, 50A Electrostatic Protection Element
52 Well Contact Region
54, 54A, 54B Drain Region
56, 56B Source Region 58, 58A, 58B, 58C Gate
60, 60A, 60B, 60C ESD Protection Transistor
B1, B2, B3 Parasitic Bipolar Transistor
OA1 to OA3 Opposing Region
T1 to T4 Terminal

What is claimed is:

1. An electrostatic protection element, comprising:
a substrate of a first conductivity type having a first polarity;
an epitaxial layer of a second conductivity type having a second polarity different from the first polarity, the epitaxial layer formed on the substrate and having a well of the first conductivity type formed therein;
a transistor including a drain region formed in the well, a source region formed to face the drain region across a channel region, and a gate formed above the channel region so as to be insulated;
a well contact region of the first conductivity type disposed in the well, the well-contact region being formed at a prescribed distance from the drain region in a width direction perpendicular to a length direction of the gate, the well contact region formed so as to surround the transistor in the length direction and the width direction; and
an element isolation trench formed so as to surround the well contact region in the length direction and the width direction.

2. The electrostatic protection element according to claim 1, wherein the well contact region is located on opposite sides of the transistor in the width direction, and the well contact region is located at opposite ends of the transistor in the length direction, the well contact region being separated from the transistor in the width direction and in the length direction by the well.

3. The electrostatic protection element according to claim 2, wherein the transistor includes a plurality of transistors arranged in a row in the width direction, each of the plurality of transistors including a respective drain region and source region, and a gate between the drain region and the source region, and
wherein a first drain region located at one end of the plurality of transistors in the width direction is located a prescribed distance from the well contact region, thereby forming a first opposing region.

4. The electrostatic protection element according to claim 1, further comprising an element isolation trench formed so as to surround the well contact region in the length direction and the width direction.

5. The electrostatic protection element according to claim 4, wherein the transistor includes a plurality of transistors arranged in a row in the width direction, each of the plurality of transistors including a respective drain region and source region, and a gate between the drain region and the source region, and
wherein a first drain region located at one end of the plurality of transistors in the width direction is located a prescribed distance from the well contact region, thereby forming a first opposing region.

6. The electrostatic protection element according to claim 4, wherein the element isolation trench is formed in a surface of the well so as to be deep enough to reach the substrate.

7. The electrostatic protection element according to claim 6, wherein the transistor includes a plurality of transistors arranged in a row in the width direction, each of the plurality of transistors including a respective drain region and source region, and a gate between the drain region and the source region, and
wherein a first drain region located at one end of the plurality of transistors in the width direction is located a prescribed distance from the well contact region, thereby forming a first opposing region.

8. The electrostatic protection element according to claim 1, wherein the transistor includes a plurality of transistors arranged in a row in the width direction, each of the plurality of transistors including a respective drain region and source region, and a gate between the drain region and the source region, and
wherein a first drain region located at one end of the plurality of transistors in the width direction is located a prescribed distance from the well contact region, thereby forming a first opposing region.

9. The electrostatic protection element according to claim 8, further comprising a second drain region located at an opposite end of the plurality of transistors in the width direction from the first drain region,
wherein the second drain region faces the well contact region, thereby forming a second opposing region.

10. A semiconductor device, comprising:
an internal circuit having a connection terminal to be connected externally and configured to perform prescribed processes; and
the electrostatic protection element according to claim 1 in which the gate and the source region are grounded and the drain region is connected to the connection terminal.

11. The electrostatic protection element according to claim 1, wherein a side of the drain region opposite the gate and the source region faces the well contact region across an opposing region.

12. The electrostatic protection element according to claim 11, wherein the opposing region contacts the side of the drain region from one end to another end in the length direction.

* * * * *